(12) United States Patent
Nikonov et al.

(10) Patent No.: US 9,712,171 B2
(45) Date of Patent: Jul. 18, 2017

(54) CLOCKED ALL-SPIN LOGIC CIRCUIT

(71) Applicants:Dmitri E. Nikonov, Beaverton, OR (US); Sasikanth Manipatruni, Hillsboro, OR (US); Ian A. Young, Portland, OR (US); Vehbi Calayir, Pittsburgh, PA (US)

(72) Inventors: Dmitri E. Nikonov, Beaverton, OR (US); Sasikanth Manipatruni, Hillsboro, OR (US); Ian A. Young, Portland, OR (US); Vehbi Calayir, Pittsburgh, PA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/129,527

(22) PCT Filed: Sep. 11, 2013

(86) PCT No.: PCT/US2013/059279
§ 371 (c)(1),
(2) Date: Dec. 26, 2013

(87) PCT Pub. No.: WO2015/038118
PCT Pub. Date: Mar. 19, 2015

(65) Prior Publication Data
US 2016/0248427 A1    Aug. 25, 2016

(51) Int. Cl.
*H03K 19/16*     (2006.01)
*G06F 7/501*     (2006.01)
(Continued)

(52) U.S. Cl.
CPC .............. *H03K 19/16* (2013.01); *B82Y 25/00* (2013.01); *G06F 7/501* (2013.01); *H03K 3/45* (2013.01); *H03K 19/20* (2013.01)

(58) Field of Classification Search
None
See application file for complete search history.

(56) References Cited

U.S. PATENT DOCUMENTS 5,652,445 A * 7/1997 Johnson .................. G11C 11/16
257/295
6,774,391 B1 * 8/2004 Cowburn ............... B82Y 10/00
257/14
(Continued)

FOREIGN PATENT DOCUMENTS

TW    200540443     12/2005
TW    200540443 A   12/2005

OTHER PUBLICATIONS

Calayir, et al., "Static and Clocked Spintronic Circuit Design and Simulation with performance analysis relative to CMOS", IEEE Transactions on Circuits and Systems, I: Regular Papers, May 7, 2013, 14 pages.*
(Continued)

*Primary Examiner* — Crystal L Hammond
(74) *Attorney, Agent, or Firm* — Blakely, Sokoloff, Taylor & Zafman LLP

(57) ABSTRACT

Described is a latch comprising: a first all-spin logic (ASL) device; a second ASL device coupled to the first ASL device, the second ASL device controllable by a clock signal; and a third ASL device coupled to the second ASL device, wherein the first and third ASL devices have respective magnets coupled to a power supply terminal. Described is a flip-flop which comprises: a first ASL device; a second ASL device coupled to the first ASL device, the second ASL device controllable by a first clock signal; a third ASL device coupled to the second ASL device, the third ASL device controllable by a second clock signal, the second clock signal being out of phase relative to the first clock signal; and a fourth ASL device coupled to the third ASL device,
(Continued)

wherein the first and fourth ASL devices have respective magnets coupled to a power supply terminal.

21 Claims, 13 Drawing Sheets

(51) Int. Cl.
*H03K 19/20* (2006.01)
*B82Y 25/00* (2011.01)
*H03K 3/45* (2006.01)

(56) References Cited

U.S. PATENT DOCUMENTS

| | | | |
|---|---|---|---|
| 7,196,367 B2* | 3/2007 | Nikonov | H01L 29/66984 257/295 |
| 8,198,919 B1* | 6/2012 | Kozhanov | H01F 10/3254 326/104 |
| 8,400,066 B1 | 3/2013 | Pileggi et al. | |
| 8,558,571 B2 | 10/2013 | Behin-Aein et al. | |
| 9,203,013 B2* | 12/2015 | Li | G11C 11/16 |
| 2006/0083088 A1* | 4/2006 | Katti | G11C 11/16 365/201 |
| 2006/0145806 A1* | 7/2006 | Kim | H03K 19/16 336/200 |
| 2008/0017843 A1* | 1/2008 | Kaushal | H01F 10/16 257/14 |
| 2008/0061869 A1* | 3/2008 | Takatori | H01L 29/66984 327/544 |
| 2009/0194832 A1* | 8/2009 | Li | G11C 11/15 257/421 |
| 2009/0273972 A1* | 11/2009 | Han | B82Y 25/00 365/173 |
| 2010/0002900 A1* | 1/2010 | Cohen | B81B 3/0021 381/396 |
| 2011/0147816 A1* | 6/2011 | Nikonov | B82Y 25/00 257/295 |
| 2011/0148458 A1* | 6/2011 | Sugibayashi | H01L 43/08 326/37 |
| 2012/0154063 A1* | 6/2012 | Nikonov | H01L 43/08 331/94.1 |
| 2012/0176154 A1* | 7/2012 | Behin-Aein | H03K 19/16 326/37 |
| 2012/0235720 A1 | 9/2012 | Jiang et al. | |
| 2012/0248556 A1* | 10/2012 | Nikonov | H01L 27/22 257/421 |
| 2013/0342253 A1* | 12/2013 | Chang | H03K 17/165 327/198 |
| 2014/0087483 A1* | 3/2014 | Ohsawa | H01J 37/08 438/3 |
| 2016/0173100 A1* | 6/2016 | Nikonov | H01L 29/66984 326/38 |

OTHER PUBLICATIONS

Sharad et al., "Ultra-High Density, High-Performance and Energy-Efficient All Spin Logic," Aug. 10, 2013.

Notification Concerning Transmittal of International Preliminary Report on Patentability of the International Searching Authority issued for International Patent Application No. PCT/US2013/059279, mailed Mar. 24, 2016.

"Design of ultra high density and low pwer computational using nano-magents" Quality Electronic Design (ISQED), 2013 14th International Symposium. Mar. 6, 2013.

Notification of Transmittal of the International Search Report and the Written Opinion of the International Searching Authority, or the Declaration issued for International Patent Application No. PCT/US2013/059279, mailed Jun. 26, 2014.

PCT International Search Report and Written Opinion of the International Searching Authority for Int'l Application No. PCT/US2013/059279, mailed Jun. 26, 2014, 7 pages.

Sharad, et al., "Ultra-High Density, High-Performance and Energy-Efficient All Spin Logic", Cornell University Library, <URL:http://arxiv.orglpdf7 1308.2280.pdf>, Aug. 10, 2013, 11 pages.

Taiwan Office Action and Search Report for Application No. 103127920, mailed Jul. 21, 2015, with translation, 14 pages.

Sharad, et al., "Design of Ultra High Density and Low Power Computational Blocks using Nano-Magnets", Quality Electronic Design (ISQED), 2013 14$^{th}$ International Symposium, Mar. 6, 2013, 8 pages.

Calayir, et al., "Static and Clocked Spintronic Circuit Design and Simulation With performance Analysis Relative to CMOS", IEEE Transactions on Circuits and Systems, I: Regular Papers, May 7, 2016 , 14 pages.

Calayir, et al., "Static and Clocked Spintronic Circuit Design and Simulation with Performance Analysis Relative to CMOS", IEEE Transactions on Circuits and Systems, Regular Papers, vol. 61, No. 2, Feb. 2014, 14 pages.

Office Action for counterpart Chinese Application No. 201410459270.9, 7 pages, mailed Oct. 27, 2016.

\* cited by examiner

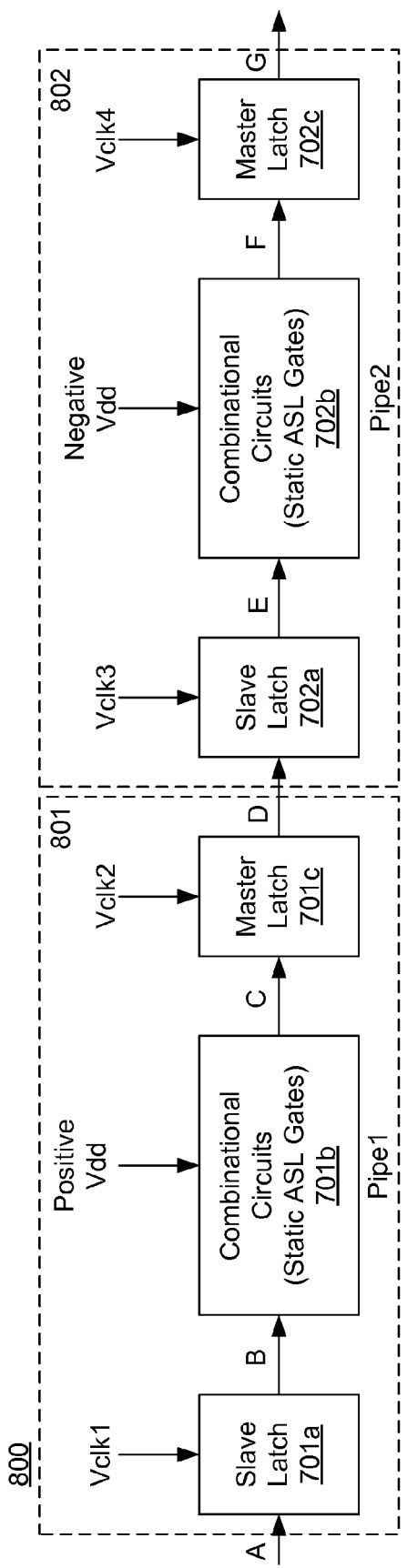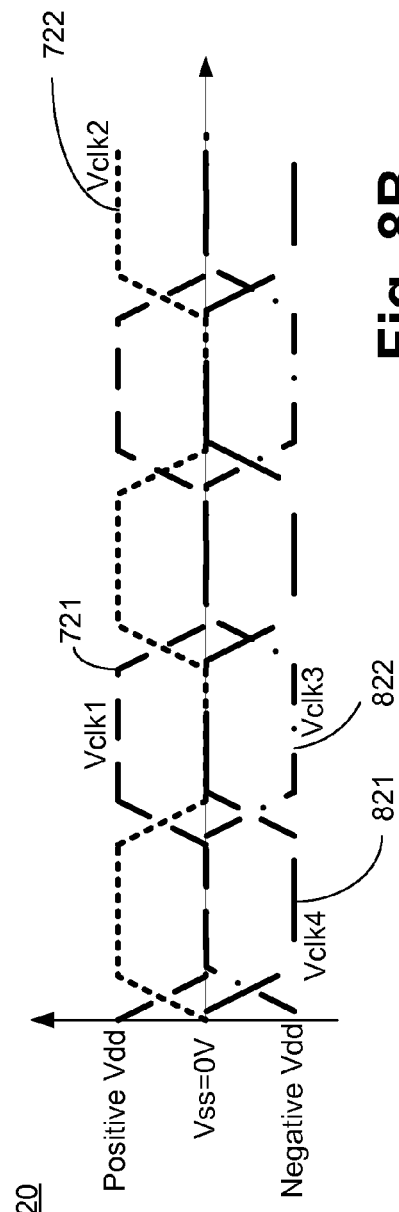
Fig. 8A
Fig. 8B

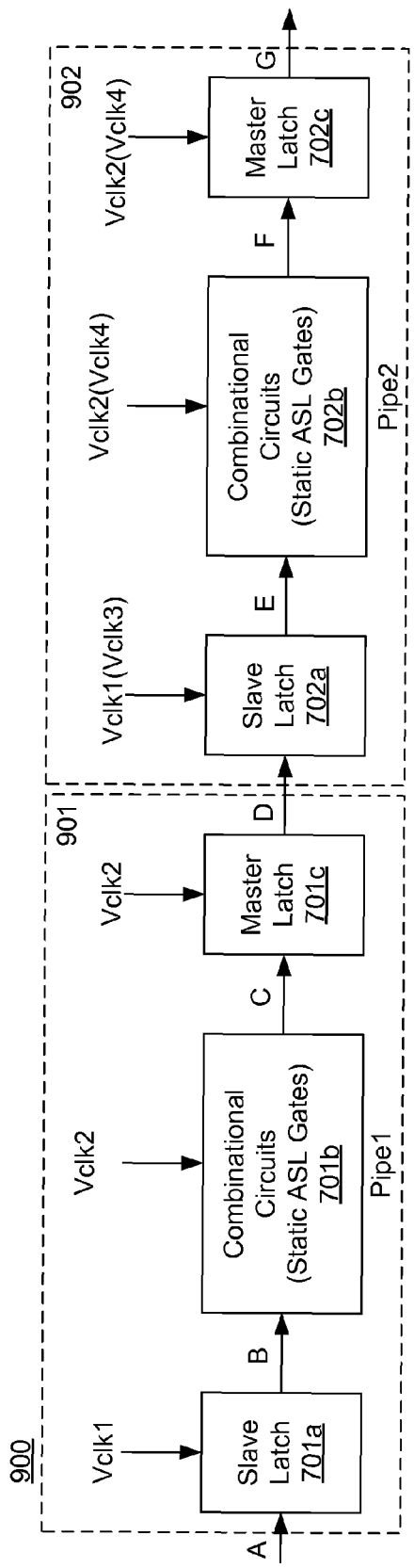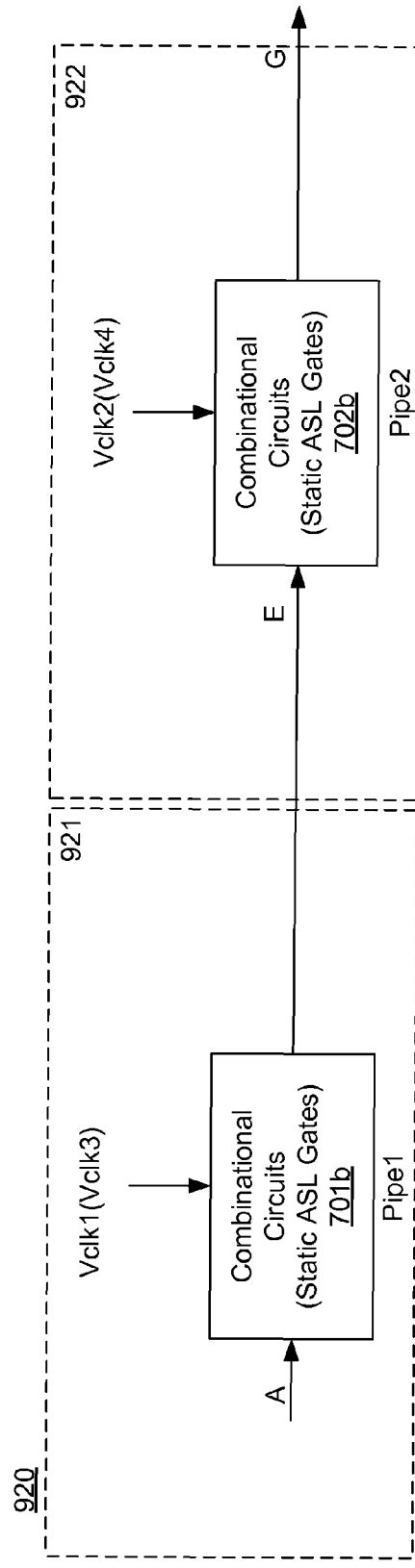
Fig. 9A
Fig. 9B

CLOCKED ALL-SPIN LOGIC CIRCUIT

CLAIM OF PRIORITY

This application claims the benefit of priority of International Patent Application No. PCT/US2013/059279 filed Sep. 11, 2013, titled "CLOCKED ALL-SPIN LOGIC CIRCUIT," which is incorporated by reference in its entirety.

BACKGROUND

To seek a way to continue integrated circuit scaling and make computation more energy efficient, spintronic devices can be used. In spintronic devices, electron spins carry and store the information. One feature of such devices is their non-volatility (i.e., the computational state is preserved even when power to the circuit is turned off). This feature opens a path to normally-off, instantly-on logic chips which consume much less static power and thus are very desirable for mobile systems. Another feature of spintronic devices is that a collective state of particles (rather than individual electrons) experiences switching. Thus, spintronic devices have a much lower limit of switching energy per bit. The supply voltage of a spintronic device may not be related to leakage current and can be reduced to tens of milli-volts. This leads to lower active power.

One example of spintronic devices is all-spin logic (ASL) device. However, while the ASL device operates at low supply voltage (e.g., 10 mV) it has static bias current at its input and output non-magnets. This increases the energy per operation.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 8A-B illustrate a pipe-line synchronous ASL logic using positive and negative power supplies and clock waveforms, according to one embodiment.

FIGS. 9A-B illustrate a pipe-line clocked ASL logic and associated clock waveforms, according to one embodiment.

DETAILED DESCRIPTION

The embodiments describe ASL devices used to realize synchronous logic latch and flip-flop sequential stage element functions. Clocking of the ASL devices reduces the static current joule heating energy consumption and combines the state element and the logic function. The embodiments also describe clocked ASL devices, different from synchronous ASL circuits. In one embodiment, for a clocked ASL device, every ferromagnet (FM) is coupled to one clock signal in the system. In one embodiment, constant supply voltage may not be used for clocked ASL devices.

Figure 1:
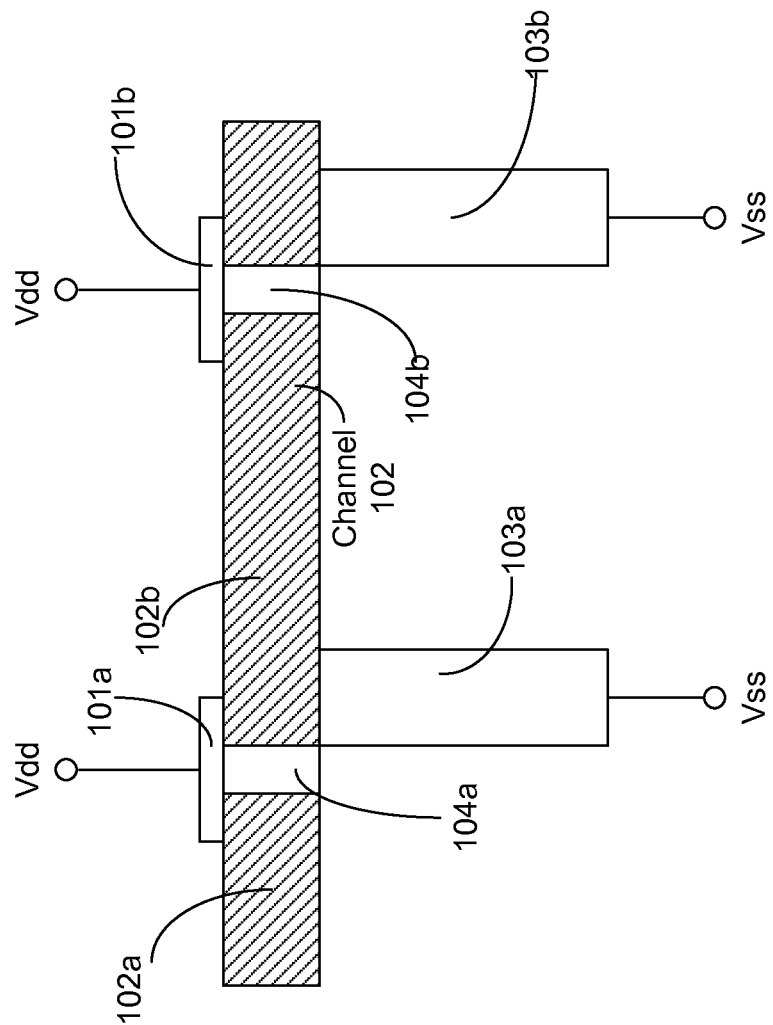
FIG. 1 illustrates a simple ASL (All-Spin-Logic) device.

FIG. 1 illustrates a simple ASL (All-Spin-Logic) device 100. The ASL device 100 includes ferromagnets (FM) 101a and 101b with respective terminals. In this example, the respective terminals are coupled to power supply (Vdd). FM 101a and FM 101b extend in the x-direction (also called first direction). In ASL, each FM (e.g. 101a) has the output ("right") side (e.g., its interface with the channel portion 102b) and the input ("left") side (e.g., its interface with the channel portion 102a), separated by spacer 104a. Similar structure exists for other ferromagnets (e.g. 101b). Spacers 104a and 104b are made from insulating material. Conducting non-magnetic (NM) metal channels 102 connect the output side of the previous stage FM and the input side of the next stage FM. Coupled to the right side of each spacer are other NM 103a and NM 103b which are coupled to ground (Vss). In one embodiment, tunneling barrier on the input side can be removed which is easier to fabricate and has a smaller resistance in the spin injection path.

ASL devices operate by spin-polarized currents flowing through a non-magnetic metal channel from the output side of a driving FM, and resulting in spin transfer torque (STT) exerted on the input side of a driven FM. The magnitude and direction of torques determine the final state of magnetization in the driven FMs.

The majority of magnetic moments of electrons in an FM (101a and/or 101b) points in the direction of magnetization. The x, y, and z unit vectors in FIG. 1 show the positive directions for each axis. The FM dimensions are selected such that its easy and hard axes are x-axis and z-axis, respectively. The magnetization of every FM has two stable states—in either the positive (+x) and negative (−x) direction. When its magnetization points in +x direction, it is treated as logic 1; and when it points in −x direction, it is treated as logic 0. Furthermore, in FIG. 1 the non-magnetic metal wires 102 are channels, and 103a/103b are ground leads. Spacers 104a/104b prevent currents flowing from one channel (e.g., first portion 102a) to the next (i.e., second portion 102b). Vdd and Vss are the power supply voltage and the ground voltage, respectively.

The non-reciprocity (i.e., input/output distinction) in ASL devices, for logic implementation, is enabled by placing the ground lead (e.g., 103a) closer to one of the FMs (e.g., 101a). Similarly, FM 101b is closer to the ground lead 103b. For the portion of the channel 102b, the driving FM is 101a and the driven FM is 101b. Even though the areas of the input and output sides may be designed to be identical, the ground lead (e.g., 103b) is close to the output side of every FM (e.g., 101b). Therefore, the resistance from Vdd to Vss is smaller on the output side (i.e., path through 101a, 102b, and 103b) than on the input side (i.e., path through 101b, 102b, and 103b), and the current is larger at the output side. Thus, the spin-polarized density is larger on the output side than that on the input side. That creates a net spin-polarized current from the output side of the driving FM 101a to the input side of the driven FM 101b. By these means multiple ASL devices can be cascaded input-to-output, without additional converting stages (i.e., concatenability).

In addition, FMs 101a and 101b have two stable, low energy states (e.g., magnetization in +x and −x directions), and spin dissipation causes magnetization to evolve toward the stable states. Therefore, the output of each stage starts in one of these stable states. In other words, the spin signal does not degrade from stage to stage and can be regenerated from relatively small spin-polarized currents if they are above the threshold value determined by the FM energy barrier (i.e., amplification). These properties make ASL devices suitable for logic implementations.

For positive supply voltages, electrons traverse from Vss to Vdd. FMs 101a/101b extract electrons from channel 102 with magnetic moments polarized in the same direction as their magnetization. This leaves the accumulation of spins with opposite magnetic moments in channel 102 under FMs 101a/101b. Due to channel 102 resistance and the position of the ground lead (103a), the charge current in the output side is much higher than that in the input side. Thus, the accumulated density of spins is higher on the output side. Electrons diffuse from output to the input side and exert STT on the driven FM. If STT is over a certain threshold value, the driven FM magnetization switches to the direction opposite to the driving FM magnetization. Hence, ASL device 100 shown in FIG. 1 operates as an inverter for positive supply voltages. Similarly, for negative supply voltages the device operates as a buffer, and the magnetization of the driven FM follows ("copies") that of the driving FM.

Figure 2:
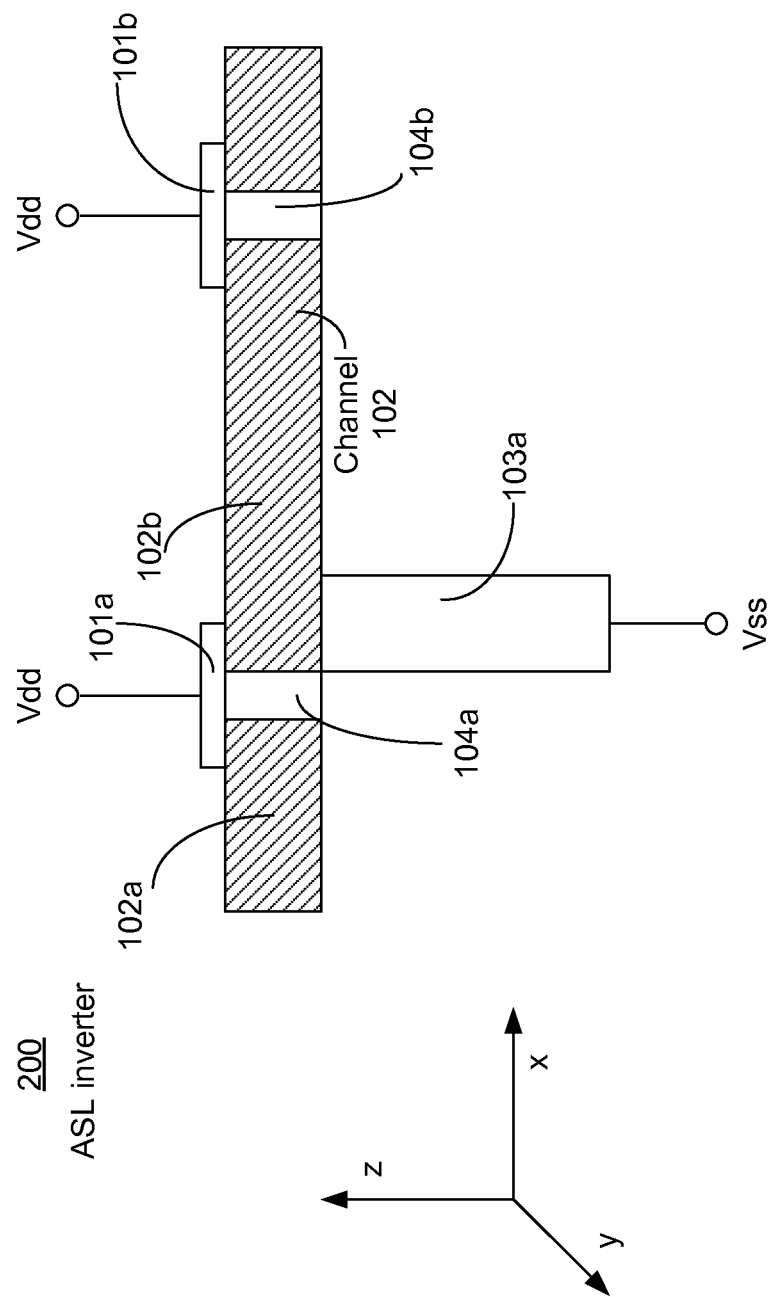
FIG. 2 illustrates an ASL inverter/buffer.

FIG. 2 illustrates an ASL inverter/buffer 200. It is pointed out that those elements of FIG. 2 having the same reference numbers (or names) as the elements of any other figure can operate or function in any manner similar to that described, but are not limited to such. ASL inverter/buffer 200 is similar to ASL 100 except for the second ground terminal 103b is removed. FM 101b is the NOT of FM 101a for a positive Vdd (i.e., for positive Vdd, an inverter is formed) and the COPY of FM 101a for a negative Vdd (i.e., for negative Vdd, a buffer is formed).

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 3:
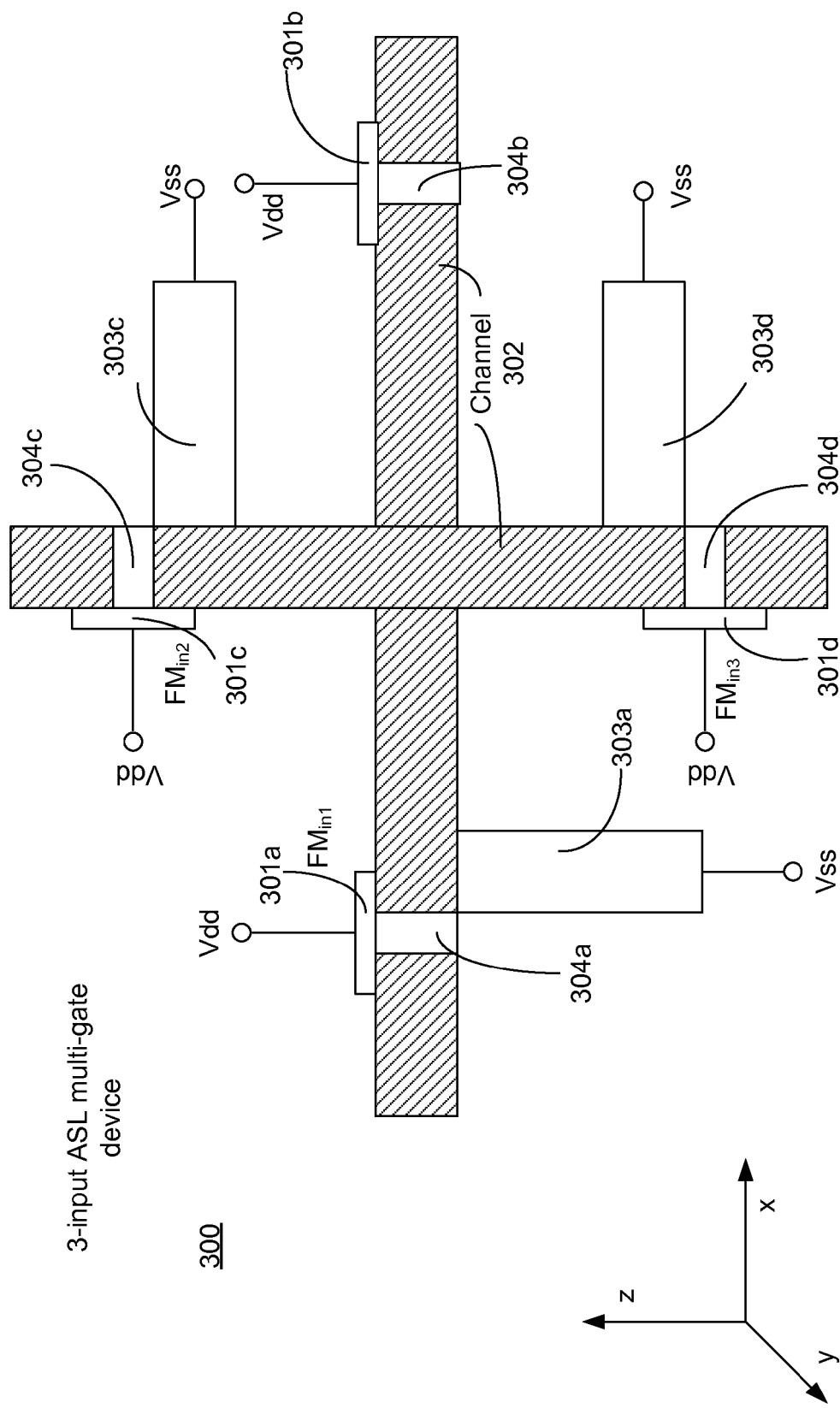
FIG. 3 is a static 3-input ASL logic, according to one embodiment.

FIG. 3 is a static 3-input ASL logic 300, according to one embodiment. It is pointed out that those elements of FIG. 3 having the same reference numbers (or names) as the elements of any other figure can operate or function in any manner similar to that described, but are not limited to such.

In this embodiment, the three inputs are formed by FMs 301a, 301d, and 301c. In this embodiment, the three ASL devices are coupled together via a common channel 302. In one embodiment, the first ASL device comprises FM 301a, spacer 304a, and ground terminal 303a, where spacer 304a provides a barrier in channel 302. In one embodiment, the second ASL device comprises FM 301b and spacer 304b, where spacer 304b provides a barrier in channel 302. In one embodiment, the third ASL device comprises FM 301d, spacer 304d, and ground terminal 303d, where spacer 304d provides a barrier in channel 302. In one embodiment, output is revived by channel under FM 301b which has an associated spacer 304b.

In the following embodiments, different identifiers are used in different figures but they are previously discussed. For example, FM 101a in FIG. 1 is same as FM 303a in FIG. 3. Likewise, spacer 104a of FIG. 1 is same as spacer 304a of FIG. 3.

ASL logic 300 forms a majority gate (MG) based ASL device. ASL devices operate based on analog operations (i.e., summation of spin currents at the driven FM), but with the threshold barrier in the driven FM, resolve and regenerate the outputs in digital form (i.e., either of two stable states via magnetization of the driven FM). In one embodiment, MGs with odd number of inputs can be efficiently built.

In one embodiment, the driving FMs (i.e., 301a, 301c, and 301d) are equivalent. In one embodiment, ground leads (i.e., 303a, 303c, and 303d) have equal dimensions. In one embodiment, each channel 302 that connects the corresponding driving FM to the driven FM has the same dimensions as well.

TABLE 1

Truth Table for 3-input MG with illustrations of NAND/AND and NOR/OR gate designs

| | | | $FM_{out}$ | | | |
|---|---|---|---|---|---|---|
| $FM_{in1}$ | $FM_{in2}$ | $FM_{in3}$ | Positive $V_{DD}$ | | Negative $V_{DD}$ | |
| 0 | 0 | 0 | 1 | NAND | 0 | AND |
| 0 | 0 | 1 | 1 | | 0 | |
| 0 | 1 | 0 | 1 | | 0 | |
| 0 | 1 | 1 | 0 | | 1 | |
| 1 | 0 | 0 | 1 | NOR | 0 | OR |
| 1 | 0 | 1 | 0 | | 1 | |
| 1 | 1 | 0 | 0 | | 1 | |
| 1 | 1 | 1 | 0 | | 1 | |

Truth table for ASL MG gate 300 is given by Table 1. In this embodiment, the majority gates with unequal input channel lengths still function properly, but the tolerable difference in length for its correct functioning may depend on the spin diffusion length (i.e., material dependent).

NAND/AND and NOR/OR gates can be built from 3-input MG 300 by fixing the magnetization of one driving FM in either positive or negative x-direction, according to one embodiment. When it is fixed in +x direction, 3-input MG 300 operates as a NOR gate for a positive Vdd and as an OR gate for a negative Vdd. In one embodiment, when magnetization of one driving FM is fixed in −x direction, 3-input MG 300 operates as a NAND gate for a positive Vdd and as an AND gate for a negative Vdd. The summary for NAND/AND and NOR/OR designs is illustrated in Table 1 where $FM_{in1}$ (i.e., 301a) is regarded as the control while $FM_{in2}$ (i.e., 301c) and $FM_{in3}$ (i.e., 301d) are regarded as logical inputs of the NAND/AND/NOR/OR functions. In one embodiment, by permutation, any of the inputs of the majority gate can serve as the control.

Figure 4:
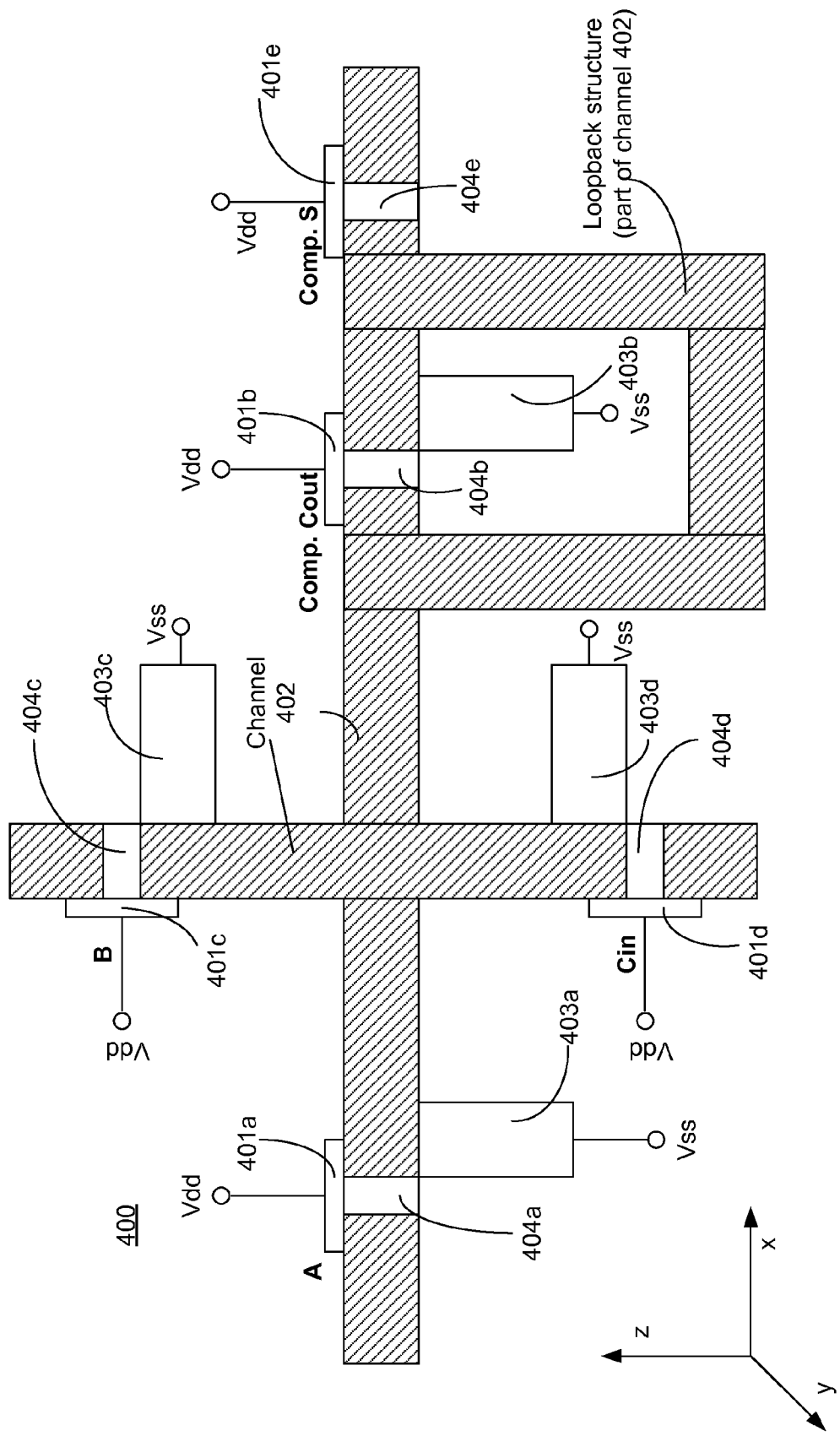
FIG. 4 is a static ASL full-adder, according to one embodiment.

FIG. 4 is a static ASL full-adder 400, according to one embodiment. It is pointed out that those elements of FIG. 4 having the same reference numbers (or names) as the elements of any other figure can operate or function in any manner similar to that described, but are not limited to such.

In one embodiment, static ASL full-adder 400 comprises five ASL devices with respective ground terminals. In this embodiment, the three inputs (i.e., A, B, and Cin) are formed by FMs 401a, 401d, and 401c, where Cin refers to carry-in input. In this embodiment, the five ASL devices are coupled together via a common channel 402. In one embodiment, the first ASL device comprises FM 401a, spacer 404a, and ground terminal 403a, where spacer 404a provides a barrier in channel 402. In one embodiment, the second ASL device comprises FM 401b, spacer 404b, and ground terminal 403b, where spacer 404b provides a barrier in channel 402. In one embodiment, the third ASL device comprises FM 401d, spacer 404d, and ground terminal 403d, where spacer 404d provides a barrier in channel 402. In one embodiment, the fourth ASL device comprises FM 401b, spacer 404b, and ground terminal 403b. In one embodiment, the fifth ASL device comprises FM 401e (i.e. Comp. S) and spacer 404e.

In one embodiment, ASL 400 is a one-bit full adder which adds two one-bit inputs (A and B) with an incoming carry Cin, and produces a sum (S) and an outgoing carry Cout as outputs. In one embodiment, Cout becomes logic 1 when at least two of three inputs to a full adder are logic 1. In one embodiment, 3-input MG with the inputs (A, B and Cin) can produce the complementary Cout (i.e., Comp. Cout) for a positive Vdd.

TABLE 2

Truth Table for ASL based Full-Adder

| A | B | $C_{in}$ | Comp. $C_{out}$ | Comp. $C_{out}$ | Comp. S | |
|---|---|---|---|---|---|---|
| 0 | 0 | 0 | 1 | 1 | 1 | XNOR |
| 0 | 0 | 1 | 1 | 1 | 0 | |
| 0 | 1 | 0 | 1 | 1 | 0 | |
| 0 | 1 | 1 | 0 | 0 | 1 | |
| 1 | 0 | 0 | 1 | 1 | 0 | XOR |
| 1 | 0 | 1 | 0 | 0 | 1 | |
| 1 | 1 | 0 | 0 | 0 | 1 | |
| 1 | 1 | 1 | 0 | 0 | 0 | |

Table 2 demonstrates that the complementary S can be obtained by the 5-input majority gate 400 with the inputs (A, B, Cin, and two complementary Cout's) for a positive Vdd. In one embodiment, the strength of the complementary Cout can be set to two times the strength of the other inputs (A, B and Cin) by adjusting the length and width of the channel between complementary Cout and S relative to the other channels as quantified by injected spin polarized current.

In one embodiment, one-bit full adder 400 is reduced to two cascaded 3-input majority gates (MG). In one embodiment, the loopback structure does not impact the input-output isolation in the magnets. In one embodiment, the magnet which serves as an input in channel 402 is determined by which one of the magnet is the closest to the ground electrode (or lead). In one embodiment, the loopback of the signal of complementary to its input part does not alter the dynamics of the magnet, since it injects spin polarization in the same direction as its own magnetization.

In one embodiment, when input A is set to logic 0, complementary S corresponds to the output of an XNOR (exclusive NOR) gate with the inputs (B and Cin). In one embodiment, when input A is set to logic 1, complementary S corresponds to the output of an XOR (exclusive-OR) gate again with the inputs (B and Cin). In one embodiment, any other random gates can be constructed from the ASL gates proposed in this section. In one embodiment, terminals to FM 401a-e are coupled to clock signals instead of constant power supply Vdd.

Figure 5A:
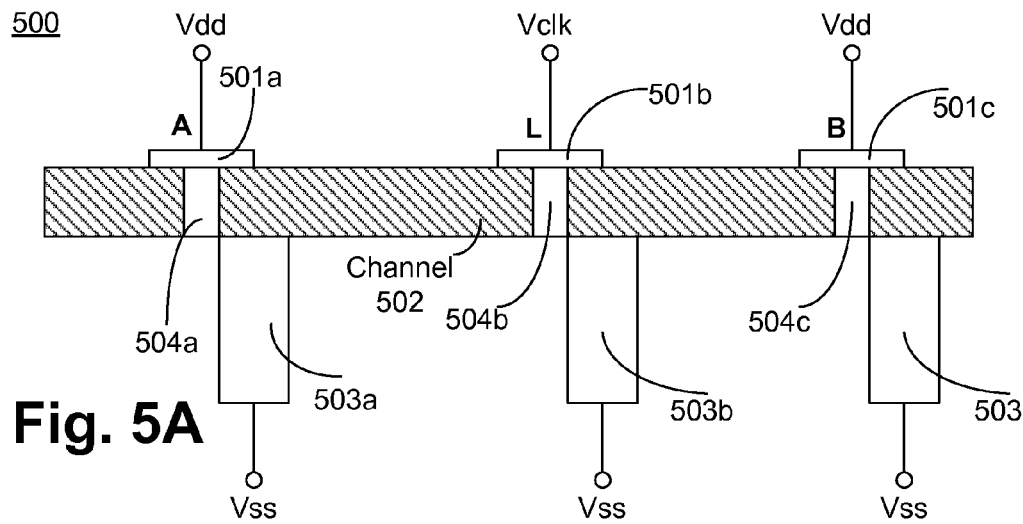
FIGS. 5A-C illustrate an ASL latch and its operating stages, according to one embodiment.
Figure 5B:
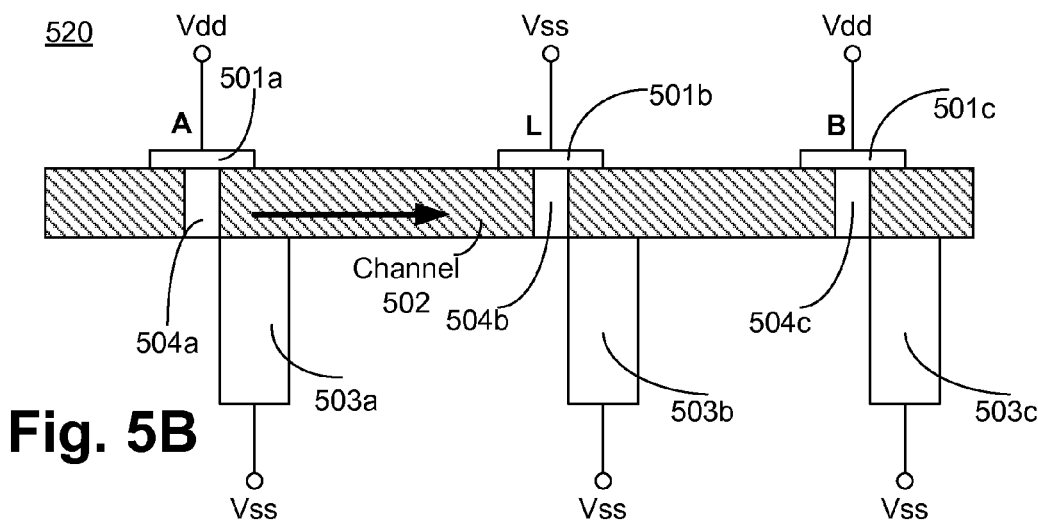
Figure 5C:
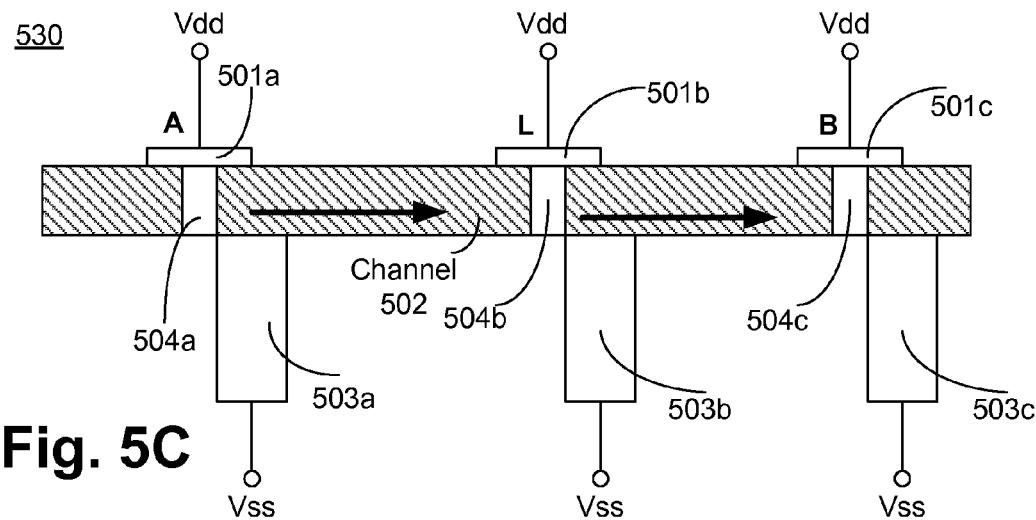

FIGS. 5A-C illustrate an ASL latch and its operating stages, according to one embodiment. It is pointed out that those elements of FIGS. 5A-C having the same reference numbers (or names) as the elements of any other figure can operate or function in any manner similar to that described, but are not limited to such.

Latches are level-sensitive devices. Latches are opaque (i.e., blocking the signal transmission between two consecutive gate stages) when the clock signal is low; and transparent (i.e., transmitting the signal from the previous stage to the next) when the clock signal is high. FIG. 5A illustrates an ASL latch 500, according to one embodiment. FIG. 5B illustrates ASL latch 520 when clock signal to ASL latch 500 is at Vss level. FIG. 5C illustrates ASL latch 530 when clock signal to ASL latch 500 is at Vdd level.

In one embodiment, ASL latch 500 comprises at least three ASL devices with three inputs. In this embodiment, the three inputs are formed by input sides of ferromagnets A 501a, L 501b, and B 501c. In this embodiment, the three ASL devices are coupled together via a common channel 502. In one embodiment, the first ASL device comprises FM 501a, spacer 504a, and ground terminal 503a, where spacer 504a provides a barrier in channel 502. In one embodiment, the second ASL device comprises FM 501b, spacer 504b, and ground terminal 503b, where spacer 504b provides a barrier in channel 502. In one embodiment, the third ASL device comprises FM 501c, spacer 504c, and ground terminal 503c, where spacer 504c provides a barrier in channel 502.

In this embodiment, Vclk is the clock signal that periodically changes between Vdd and Vss (e.g., 10 mV and 0V). In one embodiment, A is the last FM 501a in the previous stage and B is the first FM 501b in the next stage. In one embodiment, when Vclk is low as shown by latch 520, FM 501b in the middle (i.e., L) does not allow current flowing towards B, and in the meantime it samples the value of A. In one embodiment, when Vclk turns high as shown by latch 530, latch 530 becomes transparent, allowing the data flow from A to B (i.e., from the previous stage to the next stage).

In the embodiments, the clock signals (e.g., Vclk) are generated by a clock buffer (or a clock synthesis circuit). In one embodiment, the clock buffer (not shown) is controllable by a clock gating control signal which is generated by a clock control circuit (not shown). In one embodiment, the clock control circuit can dynamically apply positive, negative, or floating clock signal with controllable phase for the clock buffer to provide to the ferromagnet(s). In one embodiment, the clock control circuit comprises spin-logic devices and/or CMOS devices.

In the embodiments, the power supplies for the FMs are independently controllable. For example, in one embodiment, a control circuit is provided which generates a signal to cause a power supply select circuit to provide a positive, negative, or floating power supply to the FM. In one embodiment, the power supply select circuit comprises spin-logic devices and/or CMOS devices. In one embodiment, the control circuit comprises spin-logic devices and/or CMOS devices. In one embodiment, the clock signals and the power supplies for each of the FMs are provided by a circuit which can be independently controlled or dynamically controlled to provide positive power supply, negative power supply, floating signal, positive clock signal, or negative clock signal to the FMs. In one embodiment, the circuit comprises spin-logic devices and/or CMOS devices.

Figure 6A:
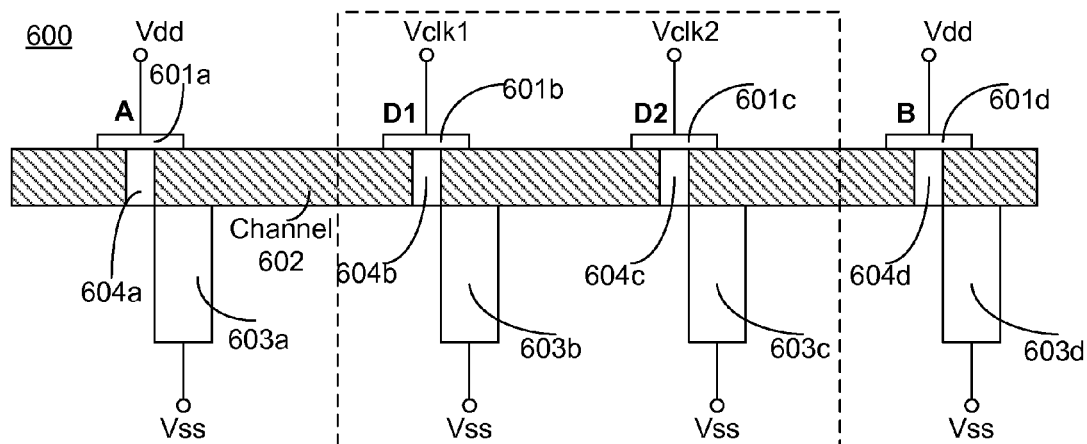
FIGS. 6A-C illustrate a positive edge-triggered ASL flip-flop and its operating stages, according to one embodiment.
Figure 6B:
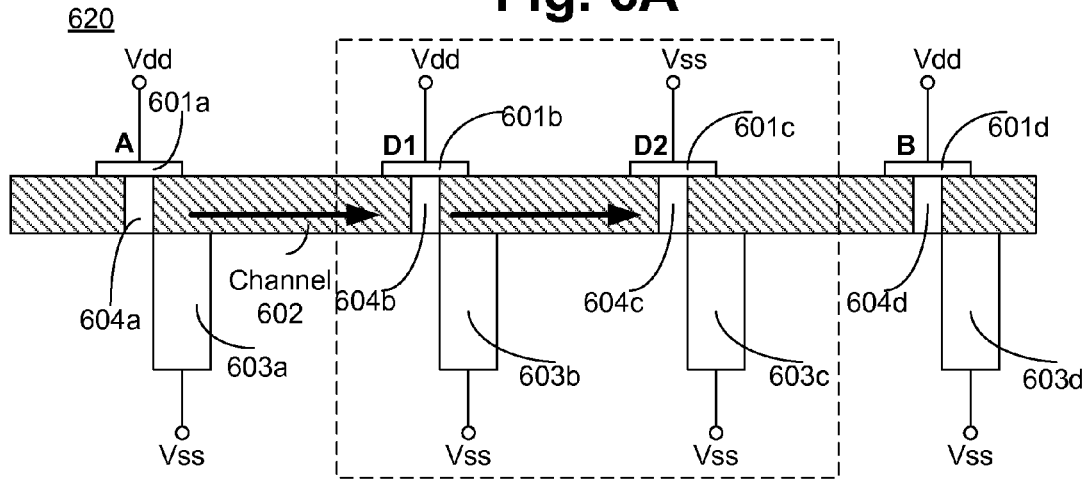
Figure 6C:
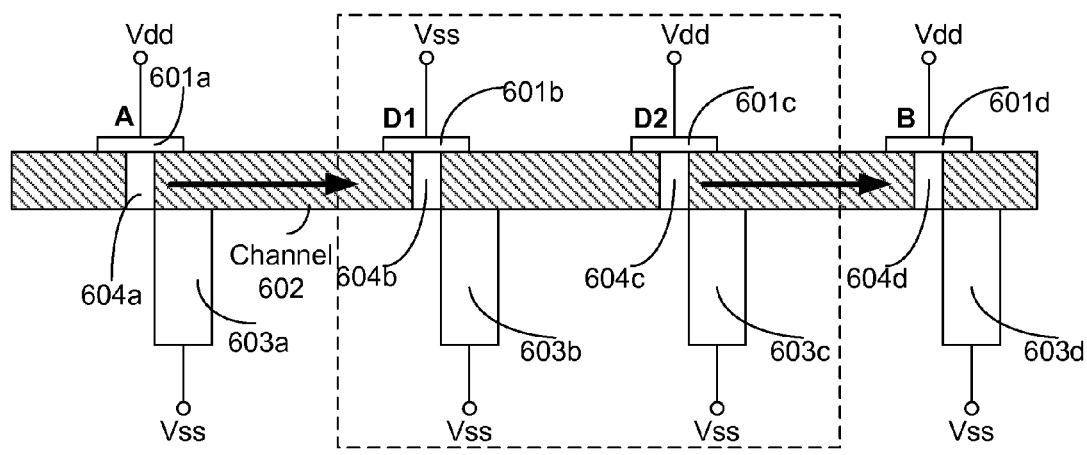

FIGS. 6A-C illustrate positive edge-triggered ASL flip-flops and their operating stages, according to one embodiment. It is pointed out that those elements of FIGS. 6A-C having the same reference numbers (or names) as the elements of any other figure can operate or function in any manner similar to that described, but are not limited to such.

DFFs (Data flip-flop) are edge-triggered sequencing elements. They transmit the sampled data at the rising or falling edge of the clock signal. A master-slave DFF can be implemented via two back-to-back latches. FIG. 6A illustrates an ASL DFF 600, according to one embodiment. FIG. 6B illustrates ASL DFF 620 where D1 is transparent ad D2 is opaque. FIG. 6C illustrates ASL DFF 630 where D is opaque and D2 is transparent.

In one embodiment, ASL DFF 600 comprises at least four ASL devices with four inputs. In this embodiment, the four inputs are formed by input sized of ferromagnets A 601a, D1 601b (which received Vclk1), D2 601c (which receives Vclk2), and B 601d, where Vclk1 and Vclk2 which are clock signals with different phases relative to one another. For example, Vclk2 is an inverted version of Vclk1. In this embodiment, the four ASL devices are coupled together via a common channel 602. In one embodiment, the first ASL device comprises FM 601a, spacer 604a, and ground terminal 603a, where spacer 604a provides a barrier in channel 602. In one embodiment, the second ASL device comprises FM 601b, spacer 604b, and ground terminal 603b, where spacer 604b provides a barrier in channel 602. In one embodiment, the third ASL device comprises FM 601c, spacer 604c, and ground terminal 603c, where spacer 604c provides a barrier in channel 602. In one embodiment, the fourth ASL device comprises FM 601d, spacer 604d, and ground terminal 603d, where spacer 604d provides a barrier in channel 602.

In one embodiment, while the master latch is transmitting, the slave latch is not and vice versa. Let's assume at time t=0 the master latch is transmitting and the slave latch is not. Therefore, the master latch starts sampling the previous stage at time t=0. When the master latch turns off and the slave latch starts transmitting, the slave latch gets the last sampled data from the master latch and transmits it to the next stage.

In one embodiment, a master-slave ASL DFF is implemented using two ASL latches coupled in series, where Vclk1 (clock signal) is the inverted Vclk2 (clock signal), A is the last FM in the previous stage, B is the first FM in the next stage, and D1 and D2 are the master and slave ASL latches, respectively. DFF shown in FIGS. 6A-C is a positive edge-triggered DFF because it transmits the sampled data from the previous stage to the next at the rising edge of Vclk.

For example, for the ASL positive edge-triggered DFF with Vclk1 and Vclk2 of 4 ns period and 50% duty cycle until 2 ns D1 is opaque and D2 is transparent. Between 2 ns and 4 ns D1 transmits the value of A to D2 while D2 is opaque. After 4 ns D2 becomes transparent and transmits the last sampled A to B. In one embodiment, a negative edge-triggered DFF is obtained by interchanging Vclk1 and Vclk2.

In one embodiment, the clocking circuitry for sequential ASL elements is built using CMOS logic to generate clocks toggling between Vss and +/−Vdd that is as low as a few or tens of mVs. In one embodiment, CMOS logic (not shown) is used to generate clock phases. In one embodiment, the CMOS logic is powered with high voltage supplies (e.g., 1V). In one embodiment, the voltage swing is lowered to a suitable level for ASL using power-efficient voltage regulator techniques (e.g., switched-capacitor DC-to-DC converter).

Figure 7A:
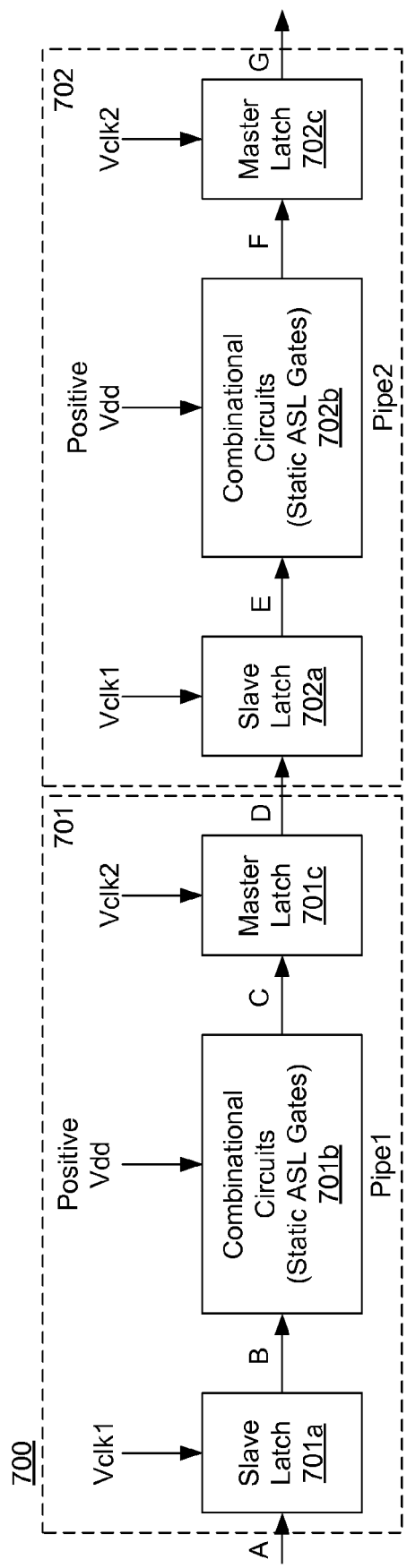
FIGS. 7A-B illustrate a pipe-line synchronous ASL logic using positive power supply and clock waveforms, according to one embodiment.
Figure 7B:
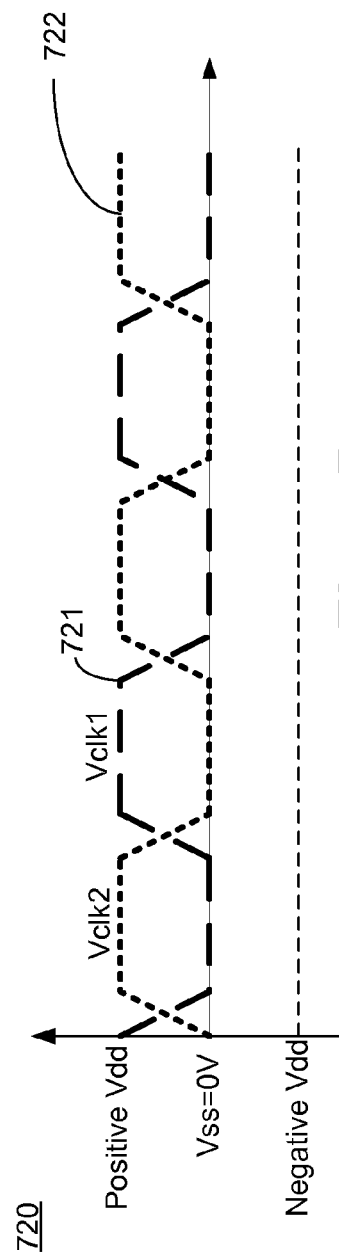

FIGS. 7A-B illustrate a pipe-line synchronous ASL logic using positive power supply and clock waveforms, according to one embodiment. It is pointed out that those elements of FIGS. 7A-B having the same reference numbers (or names) as the elements of any other figure can operate or function in any manner similar to that described, but are not limited to such.

Synchronous logic operates based on a clock signal. In one embodiment, static ASL gates (i.e., combinational ASL circuits) are coupled with sequential ASL elements to form synchronous ASL circuits. In one embodiment, a sequential ASL element is placed after every combinational ASL circuit that consists of a number of static ASL gates. FIG. 7A is a pipe-line architecture 700 with two pipes (i.e., pipe1 701 and pipe2 702) coupled in series, according to one embodiment.

In one embodiment, each pipe-line stage (e.g., 701 and 702) contains one master ASL latch 701c/702c, one slave ASL latch 701a/702a and one combinational ASL circuit 701b/702b (i.e., cascaded static ASL gates). In one embodiment, the components in the same pipe-line stage are connected to the same supply voltage while the corresponding clocks transition between that supply voltage and Vss. In one embodiment, ASL slave latch 701a receives signal A is a controlled by Vclk1. In one embodiment, output of ASL slave latch 701a is received by static ASL gates 701b which operates using positive Vdd. In one embodiment, output C of combinational circuits 701b is received by ASL master latch 701c which operates using Vclk2. FIG. 7B illustrates a plot 720 with waveforms Vclk1 721 and Vclk2 722. Here, x-axis is time and y-axis is voltage.

In one embodiment, synchronous ASL circuits comprise inverting and non-inverting ASL gates together in a single system when sequencing is provided by ASL DFFs (data flip-flops). In such an embodiment, since the master and slave latches in an ASL DFF are not simultaneously transparent, each combinational stage is isolated from every other combinational stage. In one embodiment, each combinational stage can be connected to either positive or negative supply voltage regardless of the other stages. In one embodiment, the clock signals connected to the master latches toggle between Vss and the supply voltage connected to the previous stage; and the clock signals connected to the slave latches toggle between Vss and the supply voltage connected to the next stage. In addition, the clock signals to the master and slave latches are in opposite phases such that both latches could not turn on during the same phase of the clock.

FIGS. 8A-B illustrate a pipe-line synchronous ASL logic using positive and negative power supplies and clock waveforms, according to one embodiment. It is pointed out that those elements of FIGS. 8A-B having the same reference numbers (or names) as the elements of any other figure can operate or function in any manner similar to that described, but are not limited to such.

FIG. 8A is a pipe-line architecture 800 with two pipes (i.e., pipe1 801 and pipe2 802) coupled in series, according to one embodiment. Compared to embodiment of FIG. 7A, the embodiment of FIG. 8A uses positive Vdd for pipe1 combinational logic 701b and negative Vdd for pipe2 combinational logic 702b. In this embodiment, ASL slave latch 702a operates with clock Vclk3 and ASL master latch 702c with clock Vclk4, where Vclk3 and Vclk4 are negative clock signals and out of phase relative to one another. For example, Vclk4 is an inverted Vclk3 as shown in FIG. 8B. FIG. 8B illustrates a plot 820 with waveforms Vclk3 822 and Vclk4 821. Here, x-axis is time and y-axis is voltage. In this embodiment, negative supply voltages enable a non-inverting combinational logic stage FIGS. 9A-B illustrate a pipe-line clocked ASL logic and associated clock waveforms, according to one embodiment. It is pointed out that those elements of FIGS. 9A-B having the same reference numbers (or names) as the elements of any other figure can operate or function in any manner similar to that described, but are not limited to such.

In one embodiment, in synchronous ASL circuits (as shown with reference to FIGS. 7A-B and FIGS. 8A-B) only sequential elements are connected to the clock signals, and the other elements are connected to a constant power supply. In clocked ASL devices of FIGS. 9A-B every FM is connected to one clock signal in the system. In one embodiment, no constant supply voltage is used in clocked ASL devices.

FIG. 9A is a pipe-line architecture 900 which illustrates a clocked ASL based pipe-line stages 901 and 902 concatenated together, according to one embodiment. In this embodiment, combination ASL circuits (i.e., static ASL gates) of pipe1 901 are coupled to Vclk2. In one embodiment, combination ASL circuits (i.e., static ASL gates) of pipe2 902 are coupled to Vclk2 or Vclk4. In one embodiment, when combination ASL circuits (i.e., static ASL gates) of pipe2 902 are coupled to Vclk4 then slave latch 702a of pipe2 is coupled to Vclk3 and master latch 702c of pipe2 is coupled to Vclk4. In one embodiment, when combination ASL circuits (i.e., static ASL gates) of pipe2 902 are coupled to Vclk2 then slave latch 702a of pipe2 is coupled to Vclk1 and master latch 702c of pipe2 is coupled to Vclk2.

In one embodiment, a clocked ASL system can have four different clock signals such that they are based on two pairs of 2-phase clocks. For example, Vclk1, Vlk2, Vclk3, Vclk4, where Vclk2 is out of phase relative to Vclk1, and where Vclk3 is a negative clock signal and out of phase relative to Vclk4 which is also a negative clock signal. In such an embodiment, one pair of the 2-phase clocks toggles between Vss and a positive supply voltage (e.g., Vclk1 and Vclk2) while the other pair toggles between Vss and a negative supply voltage (e.g., Vclk3 and Vclk4). In one embodiment, the FMs in the same stage can be connected to any one of these four clock signals such that the FMs in adjacent stages are connected to the clock signals that are in the opposite clock phase.

In one embodiment, all FMs in the same stage are connected to the same clock signal. For example, FMs combination circuits 701b of pipe1 901 are connected to Vclk2. FIG. 9B is a pipe-line architecture 920 which illustrates two pipes (pipe1 921 and pipe2 922) concatenated with one another. In one embodiment, since all stages are isolated from each other (i.e., two consecutive stages never simultaneously transmit the data), the clocks between stages are distributed in a similar way. For example, combinational circuit (i.e., static ASL gates) 701b of 921 operates on Vclk1 to process input A and to generate output E. In this example, combinational circuit (i.e., static ASL gates) 702b of 922 operates on Vclk2 which is out of phase relative to Vclk1. In one embodiment, when combinational circuit (i.e., static ASL gates) 701b of 921 operates on Vclk3, combinational circuit (i.e., static ASL gates) 702b of 922 operates on Vclk4.

Figure 10A:
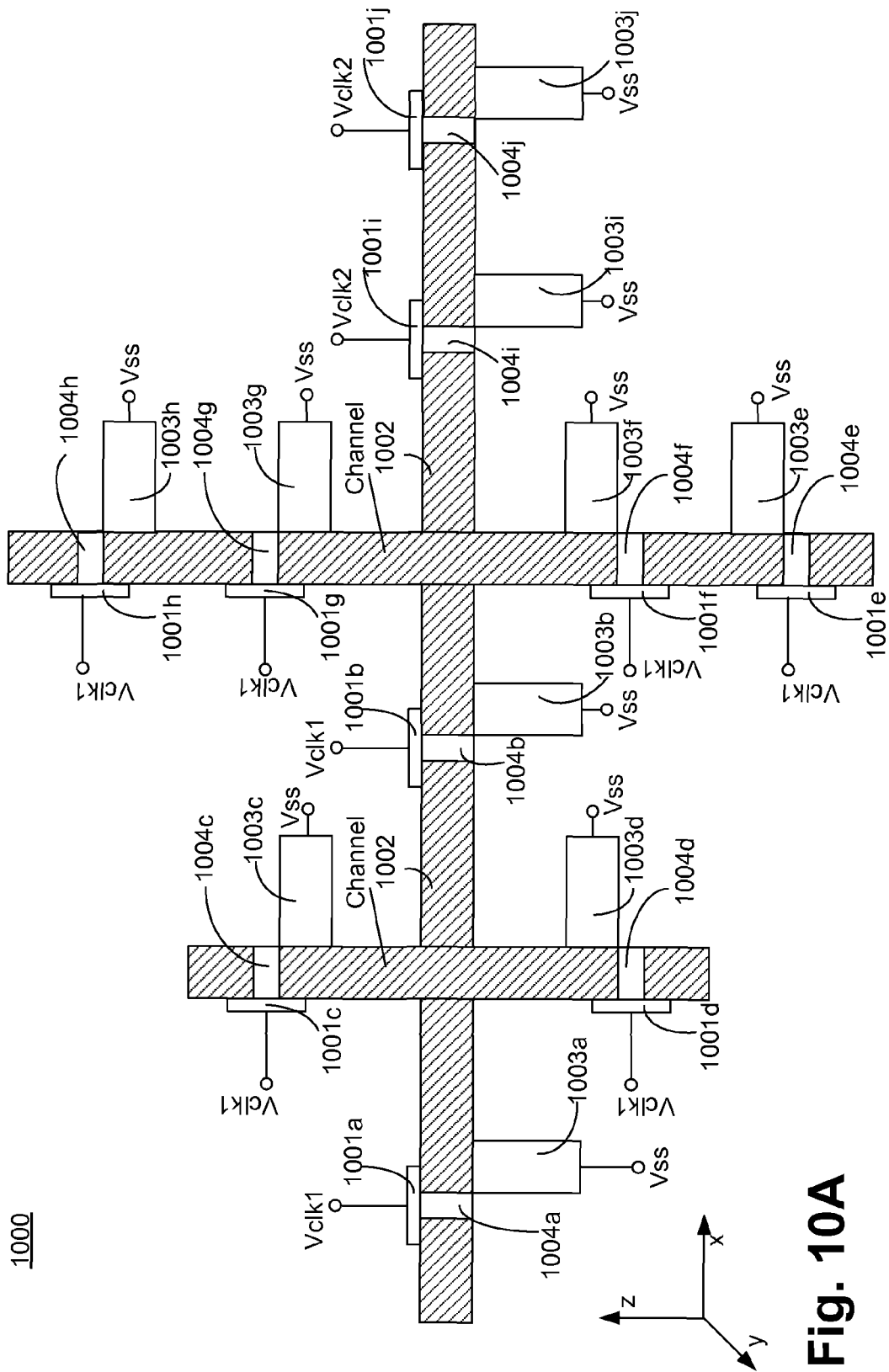
FIGS. 10A-B are exemplary embodiments of multi-gate clocked ASL logic, according to one embodiment.
Figure 10B:
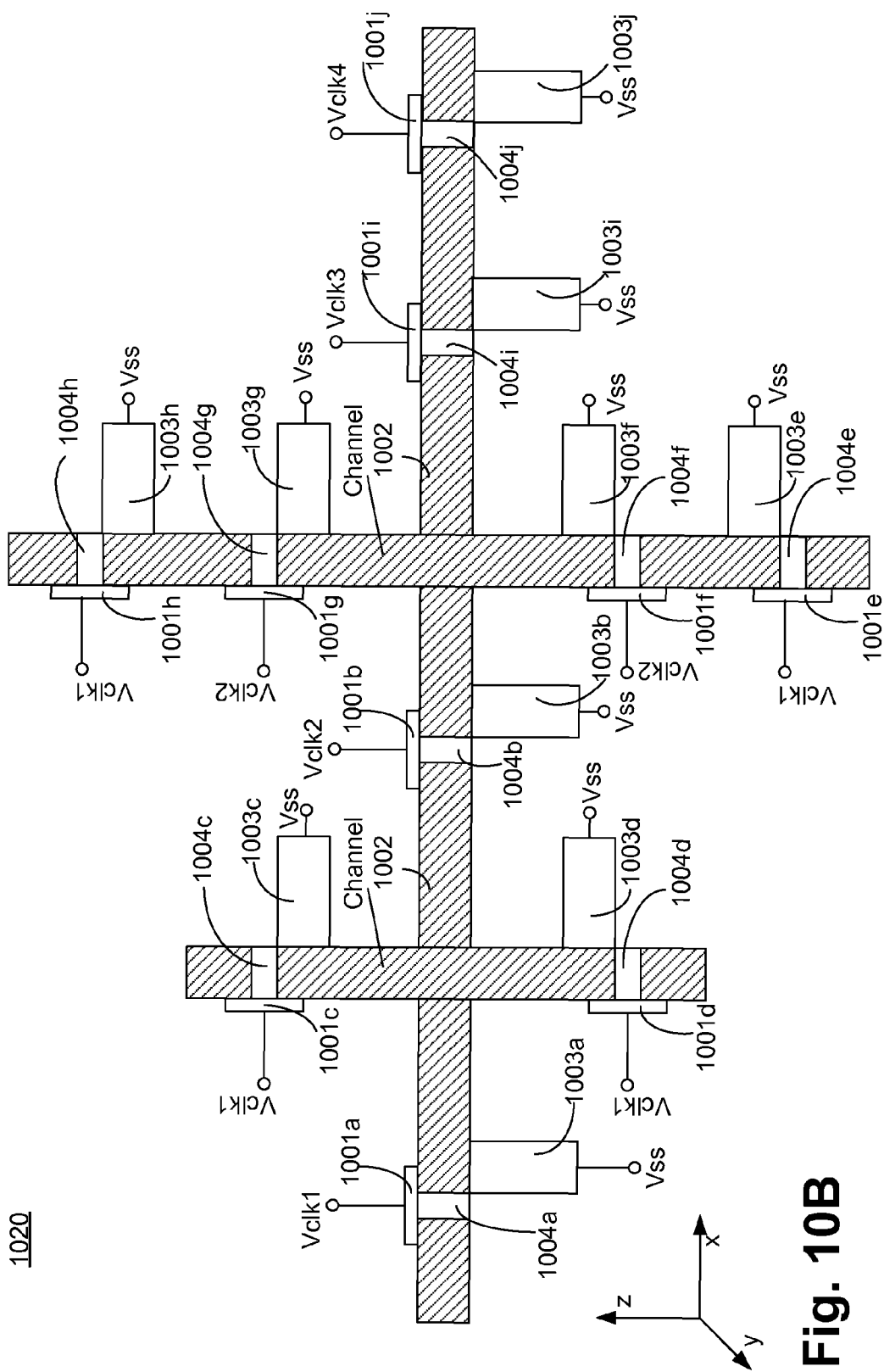

FIGS. 10A-B are exemplary embodiments of multi-gate clocked ASL device, according to one embodiment. It is pointed out that those elements of FIGS. 10A-B having the same reference numbers (or names) as the elements of any other figure can operate or function in any manner similar to that described, but are not limited to such.

In multi-gate clocked ASL device 1000 of FIG. 10A, more than one FM is cascade is clocked by the same clock signal, according to one embodiment. In one embodiment, the multi-gate clocked ASL device 1000 comprises ten FMs with ten inputs. In one embodiment, first ASL device comprises FM 1001a, channel 1002, spacer 1004a, and ground terminal 1003a. In one embodiment, second ASL device comprises FM 1001c, channel 1002, spacer 1004c, and ground terminal 1003c. In one embodiment, third ASL device comprises FM 1001d, channel 1002, spacer 1004d, and ground terminal 1003d. In this embodiment, FM 1001a, FM 1001c, and FM 1001d are controlled by Vclk1.

In one embodiment, fourth ASL device comprises FM 1001b, channel 1002, spacer 1004b, and ground terminal 1003b. In one embodiment, fifth ASL device comprises FM 1001e, channel 1002, spacer 1004e, and ground terminal 1003e. In one embodiment, sixth ASL device comprises FM 1001*f*, channel 1002, spacer 1004*f*, and ground terminal 1003*f*. In one embodiment, seventh ASL device comprises FM 1001*g*, channel 1002, spacer 1004*g*, and ground terminal 1003*g*. In one embodiment, eighth ASL device comprises FM 1001*h*, channel 1002, spacer 1004*h*, and ground terminal 1003*h*. In this embodiment, FM 1001*e*, FM 1001*f*, FM 1001*g*, FM 1001*h* are controlled by Vclk1.

In one embodiment, ninth FM comprises FM 1001*i*, channel 1002, spacer 1004*i*, ground terminal 1003*i*. In one embodiment, tenth FM comprises FM 1001*j*, channel 1002, spacer 1004*j*, ground terminal 1003*j*. In this embodiment, FM 1001*i* and 1001*j* of ninth and tenth ASL devices are controlled by Vclk2. In one embodiment, all FMs in the same stage are connected to the same clock signal. Since all stages are isolated from each other (i.e., two consecutive stages never simultaneously transmit the data), we can distribute the clocks between stages.

In multi-gate clocked ASL device 1020 of FIG. 10B, more than one FM is cascade is clocked by the same clock signal, according to one embodiment. In this embodiment, every FM in a consecutive logic stage is cocked by an alternating clock phase. For example, first stage (i.e., first, second and third ASL devices) is controlled by Vclk1, second stage (i.e., fourth, sixth, and seventh ASL devices) is controlled by Vclk2, third stage (i.e., ninth ASL device) is controlled by Vclk3, and fourth stage (i.e., tenth ASL device) is controlled by Vclk4. In this embodiment, FMs of fifth and eighth ASL devices are controlled by Vclk1.

Figure 11:
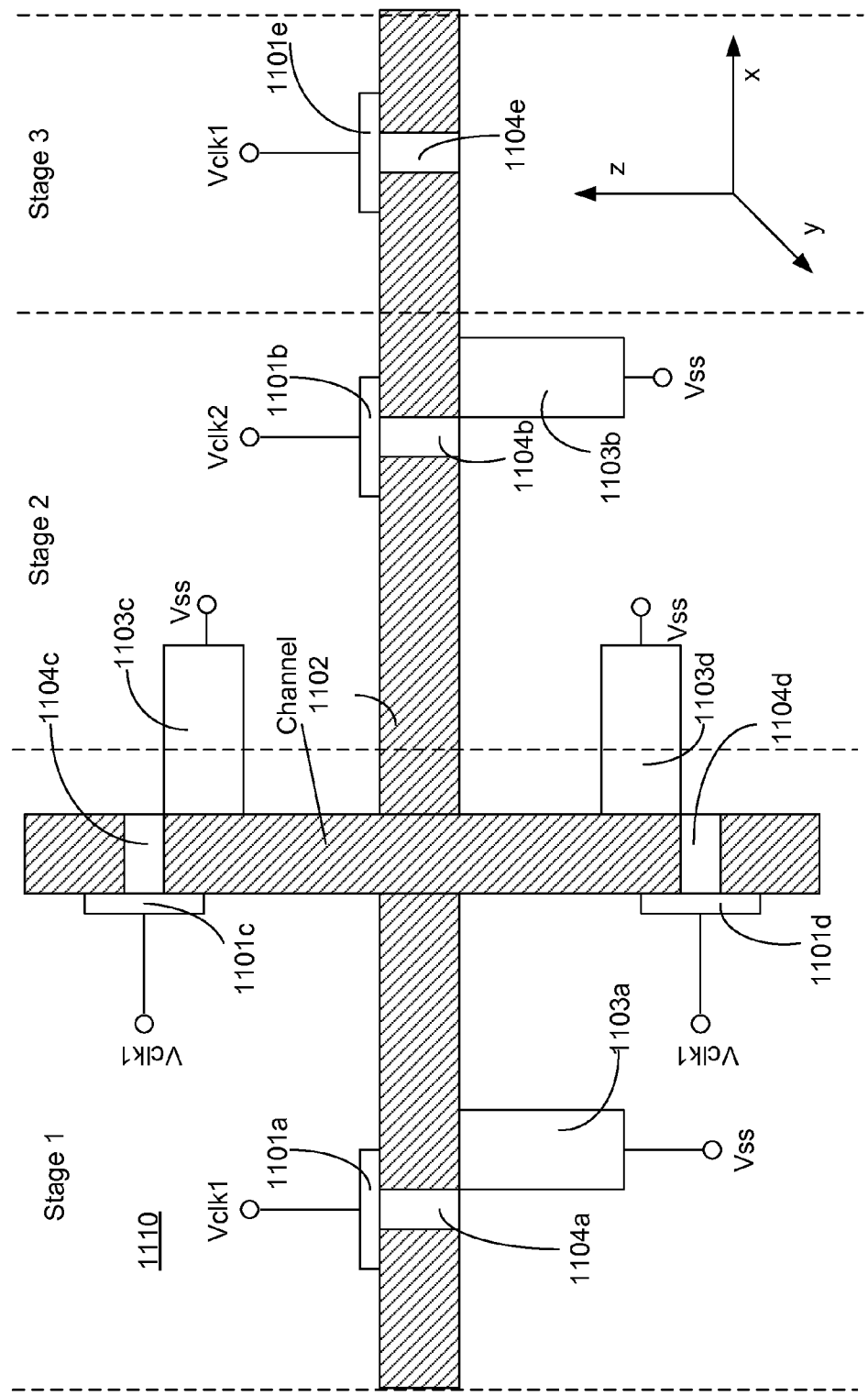
FIG. 11 is a 3-input multi-gate ASL logic driving an ASL inverter using clocked ASL devices, according to one embodiment.

FIG. 11 is a 3-input multi-gate ASL logic 1100 driving an ASL inverter using clocked ASL devices, according to one embodiment. It is pointed out that those elements of FIG. 11 having the same reference numbers (or names) as the elements of any other figure can operate or function in any manner similar to that described, but are not limited to such.

In this embodiment, multi-gate ASL logic 1100 comprises three stages—stage 1, stage 2, and stage 3. In one embodiment, stage 1 comprises first, second, and third ASL devices. In one embodiment, stage 1 is controlled by Vclk1. In one embodiment, first ASL device comprises FM 1101*a*, channel 1102, ground terminal 1103*a*, spacer 1104*a*, where FM 1101*a* is controlled by Vclk1. In one embodiment, second ASL device comprises FM 1101*c*, channel 1102, ground terminal 1103*c*, spacer 1104*c*, where FM 1101*c* is controlled by Vclk1. In one embodiment, third ASL device comprises FM 1101*d*, channel 1102, ground terminal 1103*d*, spacer 1104*d*, where FM 1101*d* is controlled by Vclk1.

In one embodiment, second stage comprises fourth ASL device. In one embodiment, fourth ASL device is controlled by Vclk2. In this embodiment, second stage is coupled to first stage. In one embodiment, fourth ASL device comprises FM 1101*b*, channel 1102, ground terminal 1103*b*, spacer 1104*b*, where FM 1101*b* is controlled by Vclk2. In one embodiment, third stage comprises fifth ASL device. In one embodiment, fifth ASL device is controlled by Vclk1. In this embodiment, third stage is coupled to second stage. In one embodiment, fifth ASL device comprises FM 1101*e*, channel 1102, and spacer 1104*e*, where FM 1101*e* is controlled by Vclk1.

In this embodiment, 3-input MG (multi-gate) 1100 is driving an inverter. For example, for Vclk1 and Vclk2 of 4 ns period and 50% duty cycle, until 2 ns only the FM 1101*b* in stage 2 transmits the signal, so the inverter is in evaluation mode and writes its result into FM 1101*e* in stage 3. In one embodiment, between 2 ns and 4 ns FMs 1101*a*, 1101*c*, 1101*d* in stages 1 and 3 transmit the signal and FM 1101*b* in stage 2 does not. When 3-input MG 1100 is in evaluation mode, the result is stored into FM 1101*b* in stage 2. After 4 ns again FM 1101*b* in stage 2 turns on, thereby switching inverter 1100 on, while the other FMs are off. In the last 2 ns all FMs are on except for the one in stage 2.

Figure 12:
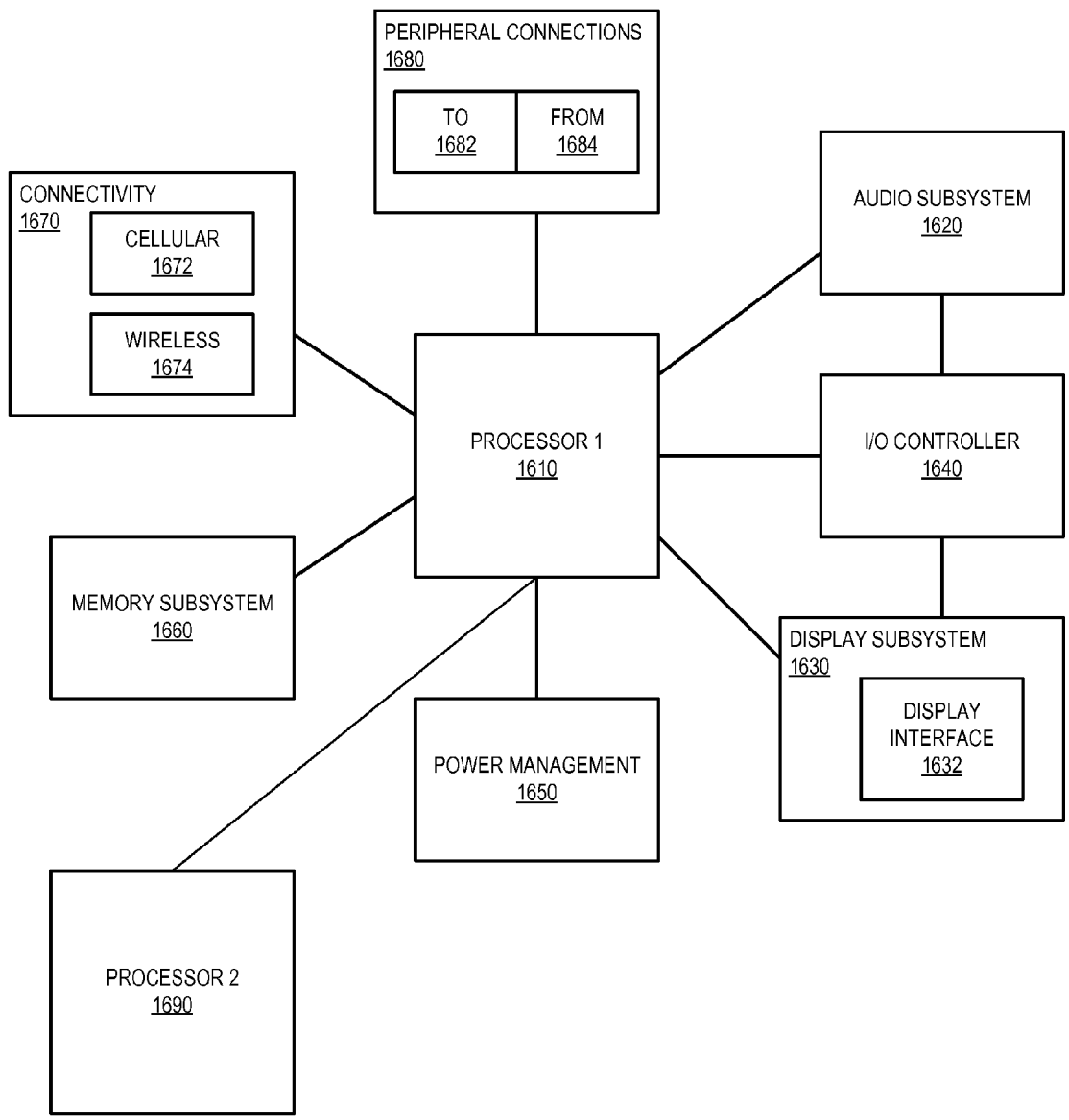
FIG. 12 is a smart device or a computer system or an SoC (system-on-chip) with ASL devices, according to one embodiment of the disclosure.

FIG. 12 is a smart device or a computer system or an SoC (system-on-chip) with synchronous and clocked ASL devices, according to one embodiment of the disclosure. FIG. 12 is a smart device or a computer system or an SoC (system-on-chip) with the bandgap reference architecture, according to one embodiment of the disclosure. It is pointed out that those elements of FIG. 12 having the same reference numbers (or names) as the elements of any other figure can operate or function in any manner similar to that described, but are not limited to such.

FIG. 12 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with synchronous and/or clocked ASL devices described with reference to embodiments. Other blocks of the computing device 1600 may also include apparatus with synchronous and/or clocked ASL devices described with reference to embodiments. The various embodiments of the present disclosure may also comprise a network interface within 1670 such as a wireless interface so that a system embodiment may be incorporated into a wireless device, for example, cell phone or personal digital assistant or a wearable device.

In one embodiment, processor 1610 (and/or processor 1690) can include one or more physical devices, such as microprocessors, application processors, microcontrollers, programmable logic devices, or other processing means. Processor 1690 may be optional. While the embodiment shows two processors, a single or more than two processors may be used. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an apparatus is provided which comprises: a first ferromagnet; a second ferromagnet coupled to the first ferromagnet, the second ferromagnet controllable by a clock signal; and a third ferromagnet coupled to the second ferromagnet, wherein the first and third ferromagnets have respective magnets coupled to a power supply terminal.

In one embodiment, each of the first, second, and third ferromagents form a first, second, and third all-spin logic (ASL) devices respectively, each of which includes: a magnet with a first terminal, the magnet extending in a first direction; a non-magnet with a second terminal, the non-magnet extending in a second direction different from the first direction; and a non-conductor coupled to the magnet, the non-conductor extending in the second direction to isolate a first portion of a non-magnet interconnect from a second portion of the non-magnet interconnect, the second portion coupled to the magnet and the non-magnet, the non-magnet interconnect extending in the first direction.

In one embodiment, the first terminal is coupled to a power supply terminal for the first ASL device. In one embodiment, the first terminal is coupled to the clock signal for the second ASL device. In one embodiment, the first terminal is coupled to a power supply terminal for the third ASL device. In one embodiment, the second terminal is coupled to ground. In one embodiment, the first terminal for each of the ASL devices is independently controllable to be coupled to a positive power supply, a negative power supply, a floating node, a positive clock signal, or a negative clock signal. In one embodiment, the apparatus further comprises a clock gating control circuit to provide a control signal for independently controlling coupling of the first terminal to a positive power supply, a negative power supply, a floating node, a positive clock signal, or a negative clock signal. In one embodiment, the power supply terminal is coupled to at least one of: a positive power supply; a negative power supply; or a floating node.

In another example, an apparatus is provided which comprises: a first ferromagnet; a second ferromagnet coupled to the first ferromagnet, the second ferromagnet controllable by a first clock signal; a third ferromagnet coupled to the second ferromagnet, the third ferromagnet controllable by a second clock signal, the second clock signal being out of phase relative to the first clock signal; and a fourth ferromagnet coupled to the third ferromagnet, wherein the first and fourth ferromagnets have respective magnets coupled to a power supply terminal.

In one embodiment, each of the first, second, third, and fourth ferromagnet form a first, second, third, and fourth all-spin logic (ASL) devices respectively, each of which include: a magnet with a first terminal, the magnet extending in a first direction; a non-magnet with a second terminal, the non-magnet extending in a second direction different from the first direction; and a non-conductor coupled to the magnet, the non-conductor extending in the second direction to isolate a first portion of a non-magnet interconnect from a second portion of the non-magnet interconnect, the second portion coupled to the magnet and the non-magnet, the non-magnet interconnect extending in the first direction.

In one embodiment, the first terminal is coupled to a power supply terminal for the first ASL device. In one embodiment, the first terminal is coupled to the first clock signal for the second ASL device. In one embodiment, the first terminal is coupled to the second clock signal for the third ASL device. In one embodiment, the first terminal is coupled to a power supply terminal for the fourth ASL device. In one embodiment, the second terminal is coupled to ground. In one embodiment, the first terminal for each of the ASL devices is independently controllable to be coupled to a positive power supply, a negative power supply, a floating node, a positive clock signal, or a negative clock signal. In one embodiment, the apparatus further comprises a clock gating control circuit to provide a control signal for independently controlling coupling of the first terminal to a positive power supply, a negative power supply, a floating node, a positive clock signal, or a negative clock signal. In one embodiment, the power supply terminal is coupled to at least one of: a positive power supply; a negative power supply; or a floating node.

In one embodiment, a pipe-line apparatus with all-spin logic (ASL) devices, the pipe-line apparatus comprising: a first pipe-line stage including: a first sequential unit including ASL devices, with one of the ASL devices having a magnet coupled to a first clock signal; a combinational logic including one or more ASL devices, the combinational logic coupled to the first sequential unit, the combinational logic having one or more magnets coupled to a power supply; and a second sequential unit including ASL devices, with one of the ASL devices having a magnet coupled to a second clock signal, the second sequential unit coupled to the combinational logic. In one embodiment, the pipe-line apparatus further comprises clock buffers to generate first and second clock signals, wherein the second clock signal being out of phase relative to the first clock signal. In one embodiment, the first and second sequential units are one of ASL based latches or ASL based flip-flops. In one embodiment, the pipe-line apparatus further comprises: a second pipe-line stage coupled to the first pipe-line stage.

In one embodiment, wherein the second pipe-line stage comprises: a first sequential unit including ASL devices, with one of the ASL devices having a magnet coupled to a third clock signal; a combinational logic including one or more ASL devices, the combinational logic coupled to the first sequential unit, the combinational logic having one or more magnets coupled to a power supply; and a second sequential unit including ASL devices, with one of the ASL devices having a magnet coupled to a third clock signal, the second sequential unit coupled to the combinational logic. In one embodiment, the power supply to the second pipe-line stage is a negative power supply.

In one embodiment, the pipe-line apparatus further comprises clock buffers to provide the third and fourth clock signals, wherein the third and fourth clock signals to oscillate between a voltage level of the negative power supply and ground. In one embodiment, wherein the power supply to the second pipe-line stage is a positive power supply. In one embodiment, the pipe-line apparatus further comprises clock buffers to provide the third and fourth clock signals, wherein the third and fourth clock signals to oscillate between a voltage level of the positive power supply and ground, wherein the third clock signal has a phase substantially phase aligned to the first clock signal, and wherein the fourth clock signal has a phase substantially aligned to the second clock signal.

In another example, a computer system is provided which comprises: a memory; a processor coupled to the memory, the processor having a latch according to the latch apparatus of the embodiments; and a wireless interface for allowing the processor to communicate with another device.

In another example, a system is provided which comprises: a memory; a processor coupled to the memory, the processor having a flip-flop according to flip-flop apparatus of the embodiments; and a wireless interface for allowing the processor to communicate with another device.

In another example, a system is provided which comprises: a memory; a processor coupled to the memory, the processor having a pipe-line apparatus according to the pipe-line apparatus of the embodiments; and a wireless interface for allowing the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first ferromagnet;
   a second ferromagnet coupled to the first ferromagnet, the second ferromagnet is controlled by a clock signal during operation; and
   a third ferromagnet coupled to the second ferromagnet, wherein the first and third ferromagnets have respective magnets coupled to a power supply terminal.

2. The apparatus of claim 1, wherein each of the first, second, and third ferromagents form a first, second, and third all-spin logic (ASL) devices respectively, each of which includes:
   a magnet with a first terminal, the magnet extending in a first direction;
   a non-magnet with a second terminal, the non-magnet extending in a second direction different from the first direction; and
   a non-conductor coupled to the magnet, the non-conductor extending in the second direction to isolate a first portion of a non-magnet interconnect from a second portion of the non-magnet interconnect, the second portion coupled to the magnet and the non-magnet, the non-magnet interconnect extending in the first direction.

3. The apparatus of claim 2, wherein the first terminal is coupled to a power supply terminal for the first ASL device.

4. The apparatus of claim 2, wherein the first terminal is coupled to the clock signal for the second ASL device.

5. The apparatus of claim 2, wherein the first terminal is coupled to a power supply terminal for the third ASL device.

6. The apparatus of claim 2, wherein the second terminal is coupled to ground.

7. The apparatus of claim 2, wherein the first terminal for each of the ASL devices is independently controllable to be coupled to a positive power supply, a negative power supply, or a floating node.

8. The apparatus of claim 7 further comprises a clock gating control circuit to provide a control signal for independently controlling coupling of the first terminal to a positive power supply, a negative power supply, or a floating node.

9. The apparatus of claim 1, wherein the power supply terminal is coupled to at least one of:
   a positive power supply;
   a negative power supply; or
   a floating node.

10. An apparatus comprising:
    a first ferromagnet;
    a second ferromagnet coupled to the first ferromagnet, the second ferromagnet is controlled by a first clock signal during operation;
    a third ferromagnet coupled to the second ferromagnet, the third ferromagnet is controlled by a second clock signal during operation, the second clock signal being out of phase relative to the first clock signal; and
    a fourth ferromagnet coupled to the third ferromagnet, wherein the first and fourth ferromagnets have respective magnets coupled to a power supply terminal.

11. The apparatus of claim 10, wherein each of the first, second, third, and fourth ferromagnet form a first, second, third, and fourth all-spin logic (ASL) devices respectively, each of which include:
    a magnet with a first terminal, the magnet extending in a first direction;
    a non-magnet with a second terminal, the non-magnet extending in a second direction different from the first direction; and
    a non-conductor coupled to the magnet, the non-conductor extending in the second direction to isolate a first portion of a non-magnet interconnect from a second portion of the non-magnet interconnect, the second portion coupled to the magnet and the non-magnet, the non-magnet interconnect extending in the first direction.

12. The apparatus of claim 11, wherein the first terminal is coupled to a power supply terminal for the first ASL device.

13. The apparatus of claim 11, wherein the first terminal is coupled to the first clock signal for the second ASL device.

14. The apparatus of claim 11, wherein the first terminal is coupled to the second clock signal for the third ASL device.

15. The apparatus of claim 11, wherein the first terminal is coupled to a power supply terminal for the fourth ASL device.

16. The apparatus of claim 11, wherein the second terminal is coupled to ground.

17. The apparatus of claim 11, wherein the first terminal for each of the ASL devices is independently controllable to be coupled to a positive power supply, a negative power supply, or a floating node.

18. The apparatus of claim 17 further comprises a clock gating control circuit to provide a control signal for independently controlling coupling of the first terminal to a positive power supply, a negative power supply, or a floating node.

19. The apparatus of claim 10, wherein the power supply terminal is coupled to at least one of:
   a positive power supply;
   a negative power supply; or
   a floating node.

20. A system comprising:
   a memory;
   a processor coupled to the memory, the processor having
      a latch which includes:
      a first ferromagnet;
      a second ferromagnet coupled to the first ferromagnet, the second ferromagnet is controlled by a clock signal during operation; and
      a third ferromagnet coupled to the second ferromagnet, wherein the first and third ferromagnets have respective magnets coupled to a power supply terminal; and
   a wireless interface for allowing the processor to communicate with another device.

21. The system of claim 20 further comprises a display unit.

* * * * *